United States Patent
Kwan et al.

(10) Patent No.: US 8,072,700 B2
(45) Date of Patent: Dec. 6, 2011

(54) OPTICAL APPARATUS FOR USE IN PHOTOLITHOGRAPHY

(75) Inventors: Yim-Bun Patrick Kwan, Aalen (DE); Erik Loopstra, Fleeze (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 1201 days.

(21) Appl. No.: 10/595,469

(22) PCT Filed: Dec. 18, 2003

(86) PCT No.: PCT/EP03/14552
§ 371 (c)(1),
(2), (4) Date: Nov. 28, 2006

(87) PCT Pub. No.: WO2005/050323
PCT Pub. Date: Jun. 2, 2005

(65) Prior Publication Data
US 2007/0076184 A1    Apr. 5, 2007

(30) Foreign Application Priority Data
Oct. 29, 2003  (DE) .................................. 103 50 546

(51) Int. Cl.
*G02B 7/02*  (2006.01)
(52) U.S. Cl. ..................... 359/820; 359/819; 359/821
(58) Field of Classification Search ............. 359/811, 359/824, 813, 819–823
See application file for complete search history.

(56) References Cited

U.S. PATENT DOCUMENTS

| 3,953,738 A * | 4/1976 | Huttner et al. ................ 378/166 |
| 4,133,602 A * | 1/1979 | Ihms ............................. 359/464 |
| 4,724,466 A | 2/1988 | Ogawa et al. |
| 6,172,738 B1 | 1/2001 | Korenaga et al. |
| 6,425,559 B1 * | 7/2002 | Oliver et al. ............... 248/176.1 |
| 6,606,144 B1 | 8/2003 | Omura |
| 6,639,696 B1 | 10/2003 | Nishio |
| 6,671,035 B2 * | 12/2003 | Eurlings et al. ................ 355/71 |
| 6,674,513 B2 | 1/2004 | Omura |
| 6,833,907 B2 * | 12/2004 | Eurlings et al. ................ 355/71 |
| 6,888,621 B2 | 5/2005 | Araki et al. |
| 6,943,965 B2 | 9/2005 | Kohl et al. |
| 2002/0080339 A1 | 6/2002 | Takahashi |
| 2003/0162101 A1 | 8/2003 | Heerens et al. |
| 2003/0197914 A1 | 10/2003 | Cox et al. |
| 2004/0008968 A1 * | 1/2004 | Lee et al. ...................... 385/142 |

FOREIGN PATENT DOCUMENTS

| DE | 10204465 A1 | 8/2003 |
| EP | 1178356 A2 | 2/2002 |
| EP | 1321823 A2 | 6/2002 |

(Continued)

*Primary Examiner* — Scott J Sugarman
*Assistant Examiner* — Brandi Thomas
(74) *Attorney, Agent, or Firm* — CrayRobinson, P.A.

(57) ABSTRACT

An optical apparatus includes an interchange mechanism and an optical assembly of an illumination system or a projection objective. At least one of the plurality of optical elements of the optical assembly is selected from among a plurality of ones selectable from the interchange mechanism which facilitates exchange of one for another in the beam path. To reduce transmission of vibration from the interchange mechanism to the optical assembly, the interchange mechanism is mounted on a structure which is substantially dynamically decoupled from the housing, and a selected selectable optical element is located at an operating position at which it is separate from the interchange mechanism.

12 Claims, 3 Drawing Sheets

FOREIGN PATENT DOCUMENTS

| | | |
|---|---|---|
| JP | 62165916 A | 7/1987 |
| JP | 5234850 A | 9/1993 |
| JP | 2001 60547 A1 | 3/2001 |
| JP | 2002509654 A2 | 3/2002 |
| JP | 2002198286 A | 7/2002 |
| JP | 2002203767 A | 7/2002 |
| JP | 2002198285 A | 7/2007 |
| WO | 9957606 A1 | 11/1999 |
| WO | 01/23935 A1 | 4/2001 |

* cited by examiner

OPTICAL APPARATUS FOR USE IN PHOTOLITHOGRAPHY

BACKGROUND OF THE INVENTION

1. Field of the Invention

The invention relates to an optical assembly having a plurality of optical elements. It also relates to a projection exposure machine having such an assembly.

2. Description of the Related Art

Optical assemblies such as objectives, illuminating systems and the like, are very sensitive to movements of their individual optical elements, for example, mirrors, both relative to one another and relative to their mounting structure.

Projection objectives, in particular for use in projection exposure machines in microlithography for producing semiconductor components in the EUVL field are disclosed, for example, from EP 1 178 356 A2. Vibrations transmitted to such projection objectives produce aberrations and/or greatly reduce the imaging quality of the projection objective such that complicated aberration corrections are rendered necessary because of the high accuracies required there.

Correction possibilities for vibration-induced aberrations are disclosed in DE 102 04 465 A1.

In order to minimize the transmission of interfering vibrations, optical assemblies, in particular projection objectives, are isolated from vibrations. Furthermore, the individual elements within the assemblies are interconnected rigidly (with high natural frequency) in such a way that they move with one another as a rigid body under the excitation of any remaining, usually low-frequency vibrations.

A dynamic separation/decoupling or vibrational decoupling of optical elements of an optical assembly whose positioning relative to the other optical elements poses less stringent requirements would be advantageous, chiefly whenever the additional introduction of interfering vibrations owing to these optical elements is likely, because they can, if appropriate, be manipulated via actuators, motors or the like.

Furthermore, it would be conceivable to fashion specific optical elements to be interchangeable, in order, for example, to be able to vary their optical properties or replace them with other ones. It would thereby be possible to provide a type of interchange mechanism at the optical assembly in order to interchange the optical elements.

The following particular problems arise in this case: it is difficult to use such an interchange mechanism to position the interchangeable optical element in the beam path of the optical assembly with sufficient accuracy and reproducibly. Moreover, the aim should be to avoid transmitting interfering vibrations through this interchange mechanism and the interchangeable optical element onto the optical assembly. A further problem is the contamination of the optical assembly or its individual optical elements by particles which would be produced by the interchange mechanism.

SUMMARY OF THE INVENTION

It is therefore the object of the present invention to create an optical imaging device and a projection exposure machine of the type mentioned at the beginning in which at least one optical element of the remaining optical elements and the optical imaging device is at least approximately dynamically decoupled and can in the process be positioned at least approximately accurately.

This object is achieved according to the invention by means of the features mentioned in Claim 1. The object is likewise achieved by means of the features mentioned in claim 4. The object is achieved by means of claim 19 with regard to the projection exposure machine.

The measures according to the invention create in a simple and advantageous way an optical assembly in which, in particular, optical elements for which the accurate positioning in the beam path relative to other optical elements is less critical, such as diaphragms or the like, can be dynamically decoupled in a simple way such that vibrations introduced by motors, actuators or the like cannot affect the remaining optical elements of the optical assembly. If there is a need for more accurate positioning of the dynamically decoupled optical element relative to the remaining optical elements and/or to the optical assembly, this can be achieved by the use of sensors.

Moreover, optical elements can be interchanged by means of an interchange mechanism. The introduction of interfering vibrations is avoided by dynamic decoupling of the optical element or the interchange mechanism from the optical assembly, that is to say transmission of undesired movements onto the optical assembly or its optical elements is prevented. In the case of optical elements which need to be more accurately positioned, it is further possible, in addition, to provide holding devices which also ensure an at least approximate vibrational decoupling.

Advantages with reference to claim 19 are yielded by analogy and with the aid of the description.

Advantageous refinements and developments of the invention arise from the further subclaims. Various embodiments of the invention are explained in principle below with the aid of the drawings.

BRIEF DESCRIPTION OF THE DRAWINGS

FIG. 2a shows a detail of a projection objective for microlithography in the field of EUVL, with a typical beam path and a revolving disc diaphragm stack;

FIG. 2b shows a view from above of a revolving disc diaphragm suitable for the projection objective in accordance with FIG. 2a;

DETAILED DESCRIPTION

Figure 1:
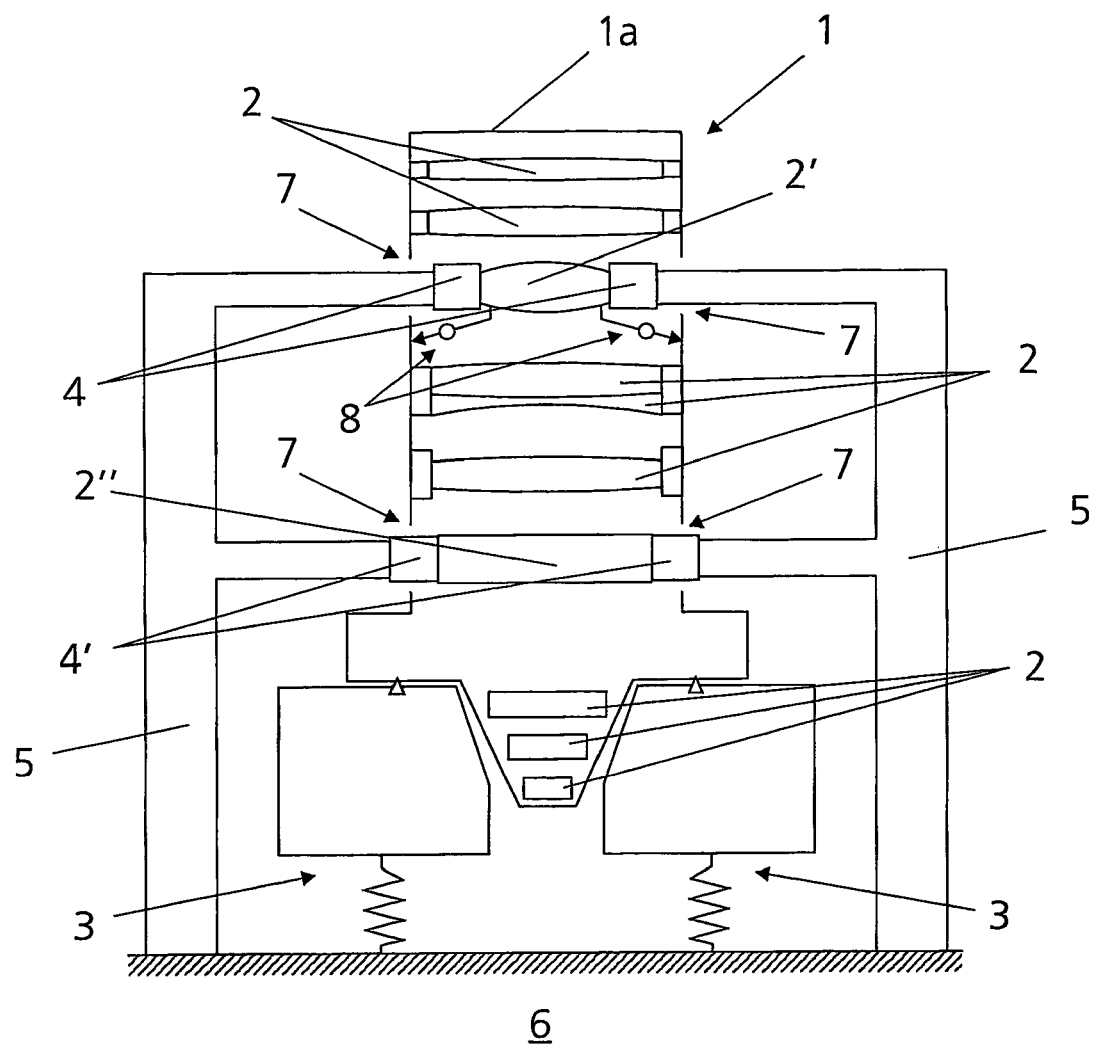
FIG. 1 shows an illustration of an optical assembly according to the invention having dynamically decoupled optical elements.

FIG. 1 illustrates as optical assembly, an objective 1 having a housing 1a. As already mentioned above, objectives 1 are very sensitive to movements of their individual optical elements 2, both relative to one another and relative to their mounting structure. The objective 1 is isolated from vibrations in order to minimize the transmission of interfering vibrations. This is performed in the present exemplary embodiment via a device 3, but no more detail on this will be considered here.

A manipulable optical element 2' is connected via actuator modules 4 to a separate structure 5, which is dynamically decoupled from the objective 1, in such a way that vibrations caused by the manipulation or reaction forces are led off to the floor 6 via the separate structure 5. The optical element 2' is thus advantageously dynamically decoupled from the objective 1 and the remainder of its optical elements 2. In order to permit such a connection of the optical element 2' to the structure 5, the objective 1 is provided with openings 7.

Accurate positioning of the optical element 2' relative to the objective 1 is performed by means of an additional determination of position via sensors 8.

Moreover, the objective 1 has as optical element 2" an iris diaphragm whose diaphragm opening can be adjusted by means of the motor (not illustrated), and which is likewise connected, via links 4', to the separate structure 5, which leads off the vibrations, caused, in particular, by the motor drive, and dynamically decouples the optical element 2" from the objective 1.

In other exemplary embodiments, the optical assembly could also be an illuminating system or the like.

Figure 2:
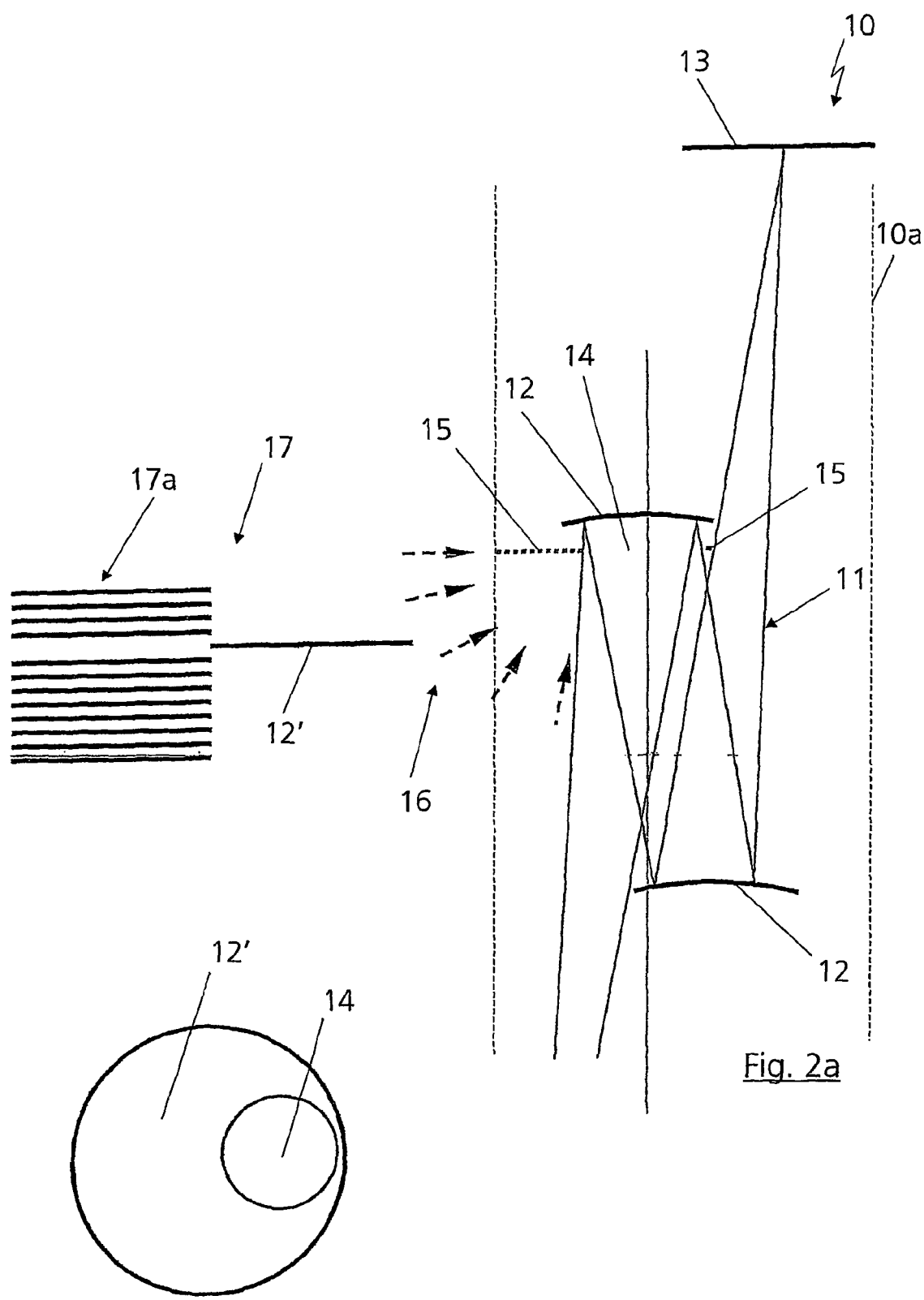
Figure 4:
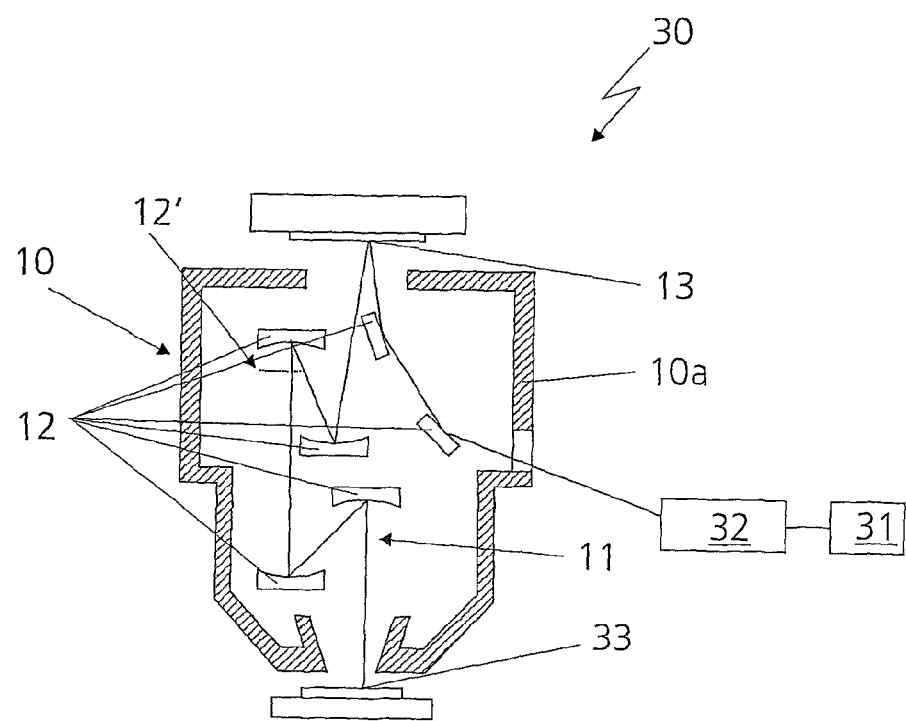
FIG. 4 shows the principle of the design of an EUV projection exposure machine with a light source, an illuminating system and a projection objective.

FIG. 2a shows a detail of a projection objective 10 for use in the field of EUVL, with its typical beam path 11 between mirrors 12 as optical elements arranged on a housing 10a, illustrated by dashes, of the projection objective 10, and an object plane 13 (explained in more detail in FIG. 4). Arranged in the beam path 11 may be a diaphragm 12', as further optical element, with a diaphragm opening 14 at its operating position 15 (indicated by dots) which serves to stop down the light beam of the projection objective 10.

As may be seen, stringent requirements are placed on the nature and the installation space of the diaphragm 12' here. Consequently, the diaphragm opening 14 should be decentral as illustrated in FIG. 2b. This requisite arrangement of the diaphragm opening 14 on the diaphragm 12', as well as the small installation space in the projection objective 10 complicate the use of conventional iris diaphragms which can be adjusted continuously by means of blades, for example, in the case of such a projection objective 10, in particular in the case of operating wavelengths in the field of EUVL.

Consequently, an interchange mechanism designed as a diaphragm device 17 is provided as substitute for the continuously adjustable diaphragm, and brings the fixed diaphragm geometries to their operating position 15 into the beam path 11 of the projection objective 10 and also removes them again. The relative positioning of the diaphragm 12' in relation to the remaining optical elements, for example, mirrors 12 of the projection objective 10, is less critical in general.

The diaphragm device 17 has a revolving disc diaphragm stack 17a, which has individual diaphragms 12', designed as revolving disc diaphragms, with fixed geometries (as illustrated in FIG. 2b) stacked vertically one above another. The diaphragm openings 14 can also have elliptical or other shapes instead of the circular shape illustrated. The revolving disc diaphragms 12' are preferably brought into the beam path 11 of the projection objective 10 to the operating position 15 provided therefor via directions indicated by arrows 16. As may be seen from FIG. 2b, the revolving disc diaphragms 12' are shaped in such a way that they have a thin rim on the side of the neighbouring light beam, and a broad rim over the remainder of the circumference.

The projective objective 10 is isolated from vibrations. Moreover, the individual optical elements 12 inside the projection objective 10 are connected to one another rigidly (with a high natural frequency) in such a way that they move with one another as a rigid body when excited by any residual vibrations which are usually of low frequency.

It is a complicated undertaking to create an embodiment of the overall diaphragm device 17 with a sufficiently high natural frequency, since relatively large masses have to be moved and the installation space is restricted. Consequently, dynamic movements (vibrations) would be transmitted to the overall projection objective 10 by the diaphragm device 17.

A possible solution to this problem is for the entire diaphragm device 17 to be mounted on a separate structure dynamically decoupled from the projection objective 10.

An improved solution strategy consists in separating the selected revolving disc diaphragm 12' from the remainder of the diaphragm device 17 and arranging it on different structures, a holding device 18 (see FIG. 3) being provided on the projection objective 10. The remainder of the diaphragm device 17 can be mounted on a separate, dynamically decoupled, structure 19. This possible solution is outlined essentially in FIG. 3.

A further possible solution consists in fastening both the holding device 18 and a lifting mechanism 20 on the projection objective 10, while the remainder of the diaphragm device 17 is mounted on a separate structure (not shown).

Figure 3:
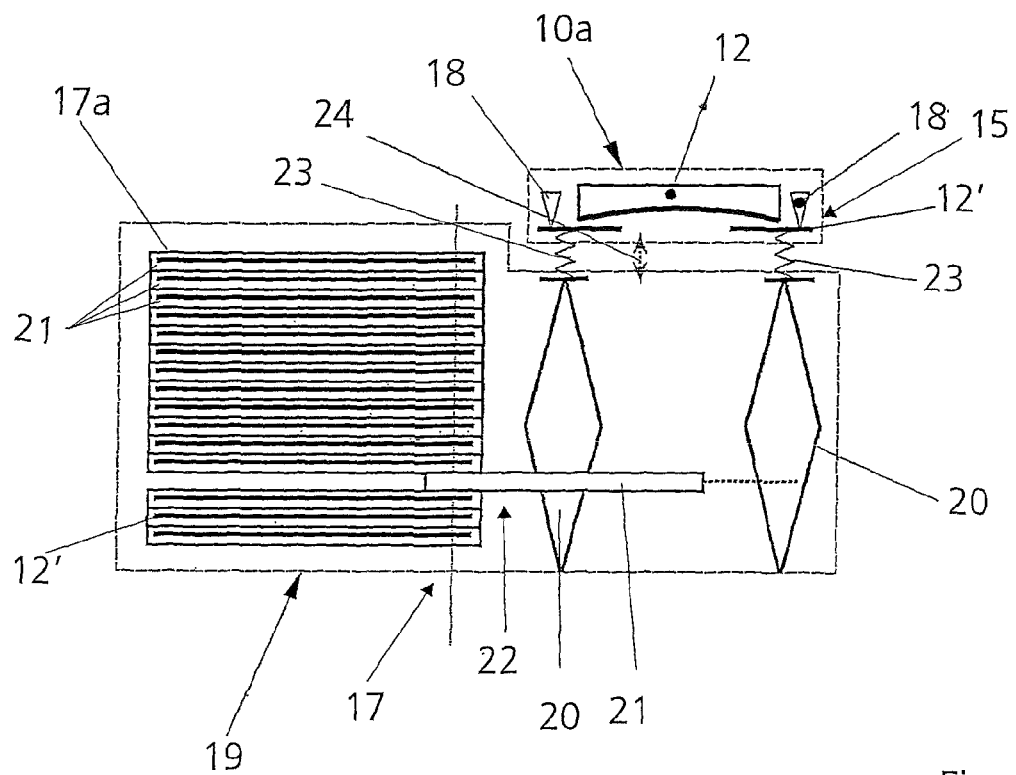
FIG. 3 shows a view of a diaphragm device with a lifting device, a holding device and with spring elements as stop for a revolving disc diaphragm.

As may be seen in FIG. 3, the revolving disc diaphragm stack 17a has a plurality of revolving disc diaphragms 12' which are accommodated in separate plug-in units 21. Each plug-in unit 21 can be rotated out individually by means of an articulation (not illustrated) common to all the plug-in units 21, such that in each case one revolving disc diaphragm 12' can be rotated out in order subsequently to be lifted in the beam path 11 of the projection objective 10 to its operating position 15.

After the operating position 15 of the revolving disc diaphragm 12' is reached, the latter is coupled to the holding device or to the stop 18. The holding device 18 permits a repeatably accurate positioning of the revolving disc diaphragms 12' in the micrometre range. This reduces the accuracy requirements for the separate plug-in units 21, and also for a lifting device 20.

The holding device 18 ensures that the revolving disc diaphragm 12' is positioned accurately relative to the projection objective 10 and in six degrees of freedom. Furthermore, there is also a need to hold or lock the revolving disc diaphragms 12' in the holding device 18 against the gravity force and other interfering forces. In order to prevent particles from contaminating the mirror surfaces, the revolving disc diaphragm 12' should be locked in this way as gently as possible.

As can further be seen in FIG. 3, the revolving disc diaphragm 12' is conveyed by means of the lifting device 20 from a removal position into its operating position 15, and held there in the holding device 18. In the case of the diaphragm device 17 illustrated in FIG. 3, use was made of mainly rotary mechanisms in order to position the revolving disc diaphragms 12' since, by contrast with translation mechanisms, fewer particles causing contamination, for example, by friction forces, are produced. Furthermore, the essentially constant force for holding the revolving disc diaphragm 12' in the holding device 18 is effected in a simple and advantageous way by spring elements 23 of low stiffness. The spring elements 23 should be precompressed in order to avoid a large compression deflection of the spring elements 23 relative to the operating position 15 of the revolving disc diaphragm 12'. An arrow 24 indicates the dynamic decoupling or the vibrational decoupling of the separately-mounted housing 10a of the projection objective 10 (indicated by dashes) and of the remainder of the diaphragm device 17, likewise mounted separately on a fixed structure 19 (indicated by dashes).

The holding device 18 for fixing or positioning the revolving disc diaphragm 12' uses magnetic forces. This has the advantage that there are only a few or no open mechanically moveable parts which could lead to further instances of particle contamination.

In further exemplary embodiments, instead of a diaphragm it would also be possible for further optical elements to be dynamically decoupled in such a way and positioned interchangeably in the projection objective 10. Of course, the optical elements can also be supported in mounts or the like.

As may be seen from FIG. 4, an EUV projection exposure machine 30 has a light source 31, an EUV illuminating system 32 for illuminating a field in the object plane 13 in which a pattern-bearing mask is arranged, and the projection objective 10 with the housing 10*a* and the beam path 11 for imaging the pattern-bearing mask in the object plane 13 onto a photosensitive substrate 33 in order to produce semiconductor components. The diaphragm 12' for stopping down the projection objective 10 is indicated by dots.

What is claimed is:

1. An apparatus, comprising: an interchange mechanism and an optical assembly, said optical assembly having a housing and having a plurality of optical elements arranged along a beam path to form a projection objective or an illuminating system, said plurality of optical elements including at least one selected optical element and a plurality of remaining optical elements, said selected optical element being selectable from among a plurality of selectable optical elements available from said interchange mechanism, said interchange mechanism being operable to insert said selected optical element into the beam path, and to remove said selected optical element from the beam path, said selected optical element being inserted into an operating position in the beam path, said operating position being a position at which said selected optical element is separate from said interchange mechanism, said interchange mechanism being supported by a structure which is substantially dynamically decoupled from said housing and from said remaining optical elements arranged along the beam path.

2. An apparatus according to claim 1, wherein said interchange mechanism is located outside said housing and wherein said housing includes an opening adapted to the dimensions of said plurality of selectable optical elements such that said at least one selected optical element can be inserted into the beam path by way of said opening and removed from the beam path by way of said opening.

3. An apparatus according to claim 1, wherein said interchange mechanism comprises a lifting device for lifting said at least one selected optical element, said at least one selected optical element being positioned and/or fixed in the beam path via said lifting device.

4. An apparatus according to claim 3, wherein said lifting device is dynamically decoupled from said optical assembly and is connected to said structure which is substantially dynamically decoupled from said optical assembly.

5. An apparatus according to claim 1, further comprising a holding device which serves as a stop and/or for fixing said at least one selected optical element in the beam path.

6. An apparatus according to claim 5, wherein said holding device is connected to one of said remaining ones of said plurality of optical elements.

7. An apparatus according to claim 5, wherein said at least one selected optical element is fixed in the beam path by said holding device using a magnetic force.

8. An apparatus according to claim 3, wherein spring elements are provided between said lifting device and said at least one selected optical element.

9. An apparatus according to claim 3, wherein at least one of: (i) said interchange mechanism and (ii) said lifting device, are located outside said housing of said optical assembly.

10. An apparatus according to claim 1, wherein said at least one selected optical element comprises a revolving disc diaphragm.

11. An apparatus as claimed in claim 1, wherein said beam path comprises a beam path for EUV light.

12. A projection exposure machine for semiconductor microlithography, said projection exposure machine, comprising: an apparatus in accordance with claim 1 wherein, said beam path is a beam path for EUV light.

* * * * *